(12) United States Patent
Hojo

(10) Patent No.: US 8,549,927 B2
(45) Date of Patent: Oct. 8, 2013

(54) DEVICE AND METHOD TO SENSE BATTERY INTERNAL STATE

(75) Inventor: Katsuyuki Hojo, Toyota (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 13/337,460

(22) Filed: Dec. 27, 2011

(65) Prior Publication Data

US 2012/0090402 A1   Apr. 19, 2012

Related U.S. Application Data

(63) Continuation of application No. PCT/JP2009/003065, filed on Jul. 2, 2009.

(51) Int. Cl.
*G01N 3/00* (2006.01)

(52) U.S. Cl.
USPC .......................................................... 73/788

(58) Field of Classification Search
USPC .............................................................. 73/788
See application file for complete search history.

(56) References Cited

U.S. PATENT DOCUMENTS

| 6,215,312 B1 * | 4/2001 | Hoenig et al. ................ 324/427 |
| 8,093,902 B2 * | 1/2012 | Nishi et al. .................... 324/427 |
| 8,108,161 B2 * | 1/2012 | Tomura et al. ................. 702/63 |
| 2008/0120050 A1 * | 5/2008 | Iwane et al. .................... 702/63 |

FOREIGN PATENT DOCUMENTS

| JP | 7-6795 | 1/1995 |
| JP | 7-85892 | 3/1995 |
| JP | 2002-343992 | 11/2002 |

OTHER PUBLICATIONS

International Search Report in International Application No. PCT/JP2009/003065; Mailing Date: Sep. 29, 2009.

* cited by examiner

*Primary Examiner* — Lisa Caputo
*Assistant Examiner* — Octavia D. Hollington
(74) *Attorney, Agent, or Firm* — Finnegan, Henderson, Farabow, Garrett & Dunner, LLP

(57) ABSTRACT

Provided is a device to sense battery internal state that can sense tiny elastic waves accompanying a reaction inside a battery and can accurately ascertain changes in battery internal state. The device (10) to sense the internal state of a battery (1) comprises restraining members (5, 5) that apply compressive force to the battery (1), a non-metallic plate (11) disposed between the battery (1) and a restraining member (5), and multiple acoustic emission sensors (13) affixed to the non-metallic plate (11). Compressive force is applied to the battery (1) by the restraining members (5, 5), elastic waves (W) generated in the battery (1) are sensed by the multiple acoustic emission sensors (13), and the internal state of the battery (1) is sensed by analyzing the sensed elastic waves (W).

6 Claims, 4 Drawing Sheets

DEVICE AND METHOD TO SENSE BATTERY INTERNAL STATE

CROSS-REFERENCE TO RELATED APPLICATIONS

This application is a continuation application of International Application No. PCT/JP2009/003065, filed Jul. 2, 2009, the contents of which are incorporated herein by reference.

TECHNICAL FIELD

The present invention relates to a device and a method for detecting an internal state of a battery, more particularly, to a technique of determining a reaction in the battery by accurately detecting elastic waves occurred in the battery.

BACKGROUND ART

There is a conventional technique for detecting an internal state of a rechargeable battery such as a lithium ion secondary battery or a nickel hydride battery and visualizing a change of the inner state of battery, e.g., a reaction in the battery and a degradation of the battery.

It is known that the tiny elastic wave occurs inside the lithium ion secondary battery due to the change of the internal state during the charging or aging, such as a decomposition of an electrolyte, a mixture of moisture, a generation of bubbles involved in the formation of SEI layer on the surface of an electrode, a change of crystal structure caused by an intercalation of the lithium ion and a change of the interparticle distance.

JP H07-6795 A discloses the technique of detecting the elastic wave generated in the battery with a detection device including an AE (acoustic emission) sensor and an analysis device for analyzing the signal transmitted from the AE sensor, analyzing the feature of the elastic wave and of detecting the internal state of the battery. In this technique, analyzing the characteristics of the elastic wave detected with the detection device brings the detection for the change of the internal state of the battery such as the generation of bubbles accompanying chemical reaction and the breaking of the components due to the degradation.

However, the detection device of JP H07-6795 A does not consider the damping of the elastic wave traveling from the battery to the AE sensor, and thereby it is difficult to accurately detect the tiny elastic wave generated by the chemical reaction in the battery or the like.

The chemical reaction in the battery is closely related to the performance of the battery, so that it is required to locally find the distribution or strength of the chemical reaction in the battery during the manufacturing process. Especially, it is required to determine the location of the reaction and visualize the defects for solving the objectives due to the materials or design of the battery and the process or control system for manufacturing the same.

Unfortunately, the detection device of JP H07-6795 A may fail to accurately determine the location where the change (generation of bubbles, breaking and so on) occurs in the battery.

As mentioned above, it is difficult for the conventional detection device to accurately determine the change of the internal state inside the battery.

CITATION LIST

Patent Literature

PTL 1: JP H07-6795 A

SUMMARY OF INVENTION

Technical Problem

The objective of the present invention is to provide a device for detecting the internal state in the battery capable of detecting the tiny elastic waves accompanying the reaction inside the battery and of accurately determining the change of the internal state in the battery.

Technical Solution

The first aspect of the present invention is a detection device for detecting an internal state of a battery. The detection device includes a restraining member for pressing the battery; a non-metallic plate disposed between the battery and the restraining member; and multiple AE sensors located on the non-metallic plate. The multiple AE sensors detect an elastic wave generated in the battery, pressing the battery with the restraining member, and the detection device analyzes the detected elastic wave and determines the internal state of the battery.

In the preferable embodiment, the detection device further include means for storing multiple wave patterns prepared in advance, and the analysis for the elastic wave is performed by comparing a wave pattern detected by the AE sensors with the wave patterns.

Advantageously, the detection device further includes an elastic member disposed between the restraining member and the non-metallic plate.

More preferably, the detection device further includes a coupling medium disposed between the battery and the non-metallic plate.

The second aspect of the present invention is a detection method for detecting an internal state of a battery. The detection method includes a step for locating a non-metallic plate contacting the battery, through which a pressure applied to the battery; a step for preparing multiple AE sensors detecting an elastic wave generated in the battery on the non-metallic plate; and a step for analyzing the elastic wave detected by the multiple AE sensors and determining the internal state of the battery.

In the preferable embodiment of the detection method, the analysis for the elastic wave is performed by comparing a wave pattern detected by the AE sensors with the wave patterns.

Advantageous Effects of Invention

According to the embodiment of the present invention, the tiny elastic waves accompanying the reaction in the battery are detected and the change of the internal state in the battery is accurately determined.

REFERENCE SIGNS LIST

Figure 1:
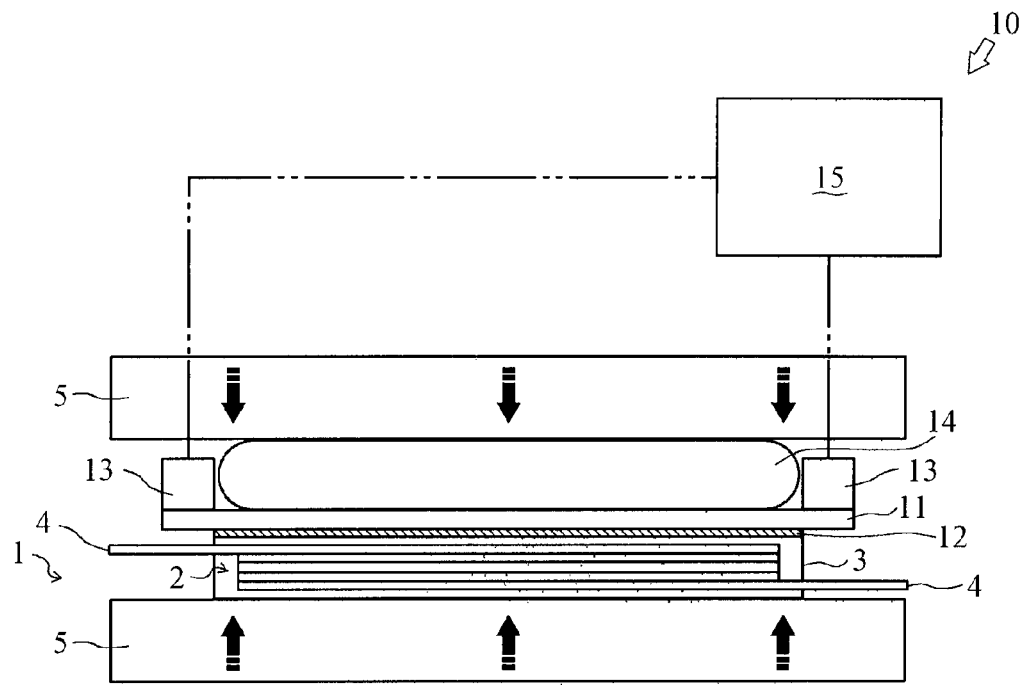
FIG. 1 illustrates a detection device for detecting an internal state of a battery and a battery to be detected.

1: battery
5: restraining plate
10: detection device
11: rigid non-metallic plate
12: coupling medium
13: AE (acoustic emission) sensor
14: elastic layer
15: AE signal analysis device

DESCRIPTION OF EMBODIMENTS

Referring to drawings, a description will be given about a battery 1 as one embodiment of the battery to be detected by a detection device according to the present invention. The battery 1 in this embodiment is a lithium ion secondary battery.

The battery 1 as a detection object may be not only the lithium ion secondary battery but also a nickel hydride battery or a nickel-cadmium battery.

As illustrated in FIG. 1, the battery 1 includes a power generating element 2 and a casing 3 in which the element 2 is housed.

The element 2 is chargeable and dischargeable electrode body to which an electrolyte is impregnated, and the electrode body is a winding member having a positive electrode sheet and a negative electrode sheet both of which are winded into a flat shape or a laminated member in which the positive and negative electrode sheets are laminated.

The casing 3 houses the element 2 and has a corresponding shape to the element 2, in detail, the casing is formed in a square can having two wide faces facing each other. From the surface of the casing 3 except the wide faces, two outer terminals 4 are projected.

The outer terminals 4 are the paths for connecting to outside of the battery, and they are electrically connected with the positive and negative electrodes of the element 2 in the casing 3, respectively.

It should be noted that the structure of the battery 1 is not limited to the above-described one, but it may be a battery such as laminated battery having the wide faces facing each other.

When charging the battery 1, the casing 3 is restrained, the outer terminals 4 are connected to the power source, and adding the electrical energy to the power generating element 2 occurs the chemical reaction in the element 2. Due to such chemical reaction, the battery 1 is charged.

More specifically, as shown in FIG. 1, pressing the battery 1 using two restraining plates 5 each of which presses the wide face of the casing 3, the battery 1 is charged. The restraining plates 5 press and restrain the battery 1, and are the plate members having larger area than the wide face (to be pressed) of the battery 1.

During the charging, in the battery 1, there occur various reactions and the internal state is changing, such as (1) a decomposition of the electrolyte, (2) a formation of the SEI layer on the surface of the electrode, (3) a change of the crystal structure of the materials due to the intercalation of the lithium ion, and (4) a change of the interparticle distance. Further, each chemical reaction as above-mentioned (1) to (4) generates the tiny elastic wave W inside the battery 1.

[First Embodiment]

The first embodiment of the present invention is a detection device 10 for detecting the tiny elastic wave W generated in the battery 1 during the charging process.

The detection device 10 detects the elastic wave W generated in the battery 1 and the change of the state in the battery 1 caused by the internal reactions, and determines the location where the internal change occurs.

As depicted in FIG. 1, the detection device 10 includes a rigid non-metallic plate 11, a coupling medium 12, multiple AE sensors 13, an elastic layer 14, and an AE signal analysis device 15.

The rigid non-metallic plate 11 has a shape (rectangular shape) corresponding to the battery 1 as a detection object of the detection device 10 and is made of a rigid material that is nonmagnetic, nonconductive and non-metallic. The plate 11 contacts the battery 1. The plate 11 prevents the elastic wave W generated in the battery 1 from damping and transmits the wave W to the AE sensors 13.

The plate 11 is made of, for example, ceramics or glass. As shown in FIG. 1, viewed from the restraining direction, the plate 11 is larger than the battery 1.

In the detection device 10, the plate 11 is interposed with respect to the battery 1, so that the elastic wave W generated in the battery 1 is prevented from damping and transmitted well. Moreover, the plate 11 is made of the non-metallic material without magnetic or conductive, and therefore there is little influence from magnetic field or induction current on the internal reaction inside the battery 1.

The coupling medium 12 is disposed between the battery 1 and the plate 11 to improve the adhesion therebetween. The coupling medium 12 is located in all area where the battery 1 and the plate 11 contact each other.

The coupling medium 12 is preferably made of a material that has near acoustic impedance to that of the casing of the battery 1 or of the plate 11, and the medium 12 may be grease or oil.

The AE sensors 13 are the detection devices for detecting the elastic waves including a sensing device such as a piezoceramic element, and the sensors detect the elastic wave W generated in the battery 1. The AE sensors 13 are located at the predetermined positions in the plate 11. The AE sensors 13 are electrically connected to the AE signal analysis device 15 and send the detection data (AE signals) of the elastic wave W to the analysis device 15 such as signal strength, frequency, duration and amplitude.

In this embodiment, four AE sensors 13 are disposed at the four corners of the rectangular plate 11. That is, each sensor 13 detects the same elastic wave W, and the location where the wave W is generated is accurately determined on the basis of the four detected data.

Note that the detection means for detecting the elastic wave W generated in the battery 1 may be not only the AE sensor 13 but also other device, which has the similar function to that.

The elastic layer 14 is made of flexible and elastic material, and formed as a balloon. The elastic layer 14 is disposed between the restraining plate 5 and the non-metallic plate 11.

The elastic layer 14 may be made of a polypropylene that is well known as the flexible material. As depicted in FIG. 1, viewed from the restraining direction, the elastic layer 14 is as large as the battery 1, and the AE sensors 13 are located outside of the elastic layer 14.

The elastic layer 14 is filled with a gas such as air, which has different acoustic impedance from the non-metallic plate 11.

In the detection device 10, the pressure from the restraining plates 5 is transmitted to the non-metallic plate 11 and the battery 1 via the elastic layer 14. That is, the elastic layer 14 makes the space between the restraining plate 5 and the non-metallic plate 11 in order to evenly transmit the pressure from the restraining plates 5 to the non-metallic plate 11 in accordance with Pascal's principle and to prevent the elastic wave W transmitted from the non-metallic plate 11 from diversion.

Figure 2:
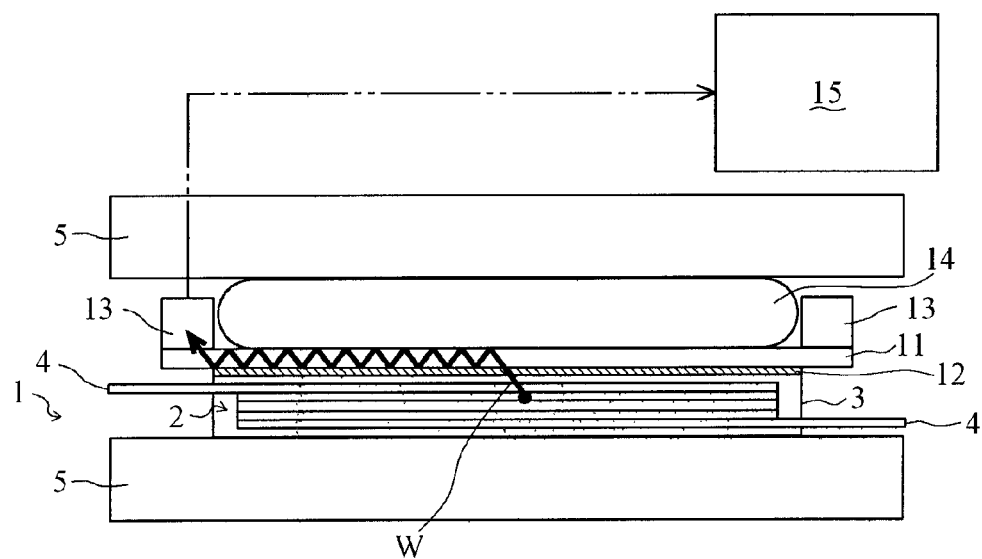
FIG. 2 shows a transmission of an elastic wave generated in the battery.

Further, pressing via the elastic layer 14 filled with the gas having different acoustic impedance from the non-metallic plate 11, as shown in FIG. 2, at the border between the non-metallic plate 11 and the elastic layer 14, the elastic wave W traveling through the non-metallic plate 11 is reflected into the non-metallic plate 11, whereby the elastic wave is efficiently transmitted to the AE sensors 13 without damping.

As described above, the battery 1 is restrained by the restraining plates 5 via the non-metallic plate 11, coupling medium 12, and the elastic layer 14. The tiny elastic wave W generated in the battery 1 is transmitted from the battery 1 to the non-metallic plate 11 through the coupling medium 12, reflecting at the border between the non-metallic plate 11 and the elastic layer 14, and the elastic wave travels through the non-metallic plate 11 to the AE sensors 13.

As a result, in the detection device 10, the tiny elastic wave W accompanying the reaction in the battery 1 can be transmitted to the AE sensors 13, and the AE sensors 13 certainly detect the tiny elastic wave W.

The AE signal analysis device 15 takes out the information (detection data) detected by the AE sensors 13, such as the strength, frequency, duration and amplitude, in time-series. The analysis device estimates the timing of initial appearance of the wave from the waveform and determines the reaction location by calculating the difference in the time of approval of signals for the same reaction detected by the AE sensors 13.

The analysis device 15 performs the pattern matching of the wave pattern P of the elastic wave W and determines the type of reaction, as well as determines the reaction location by using the method of estimating the timing of initial appearance of the elastic wave. The wave pattern P is a figural pattern drawn by connecting the outline of the waveform that is the detection data obtained by the AE sensors 13 plotted in time-series.

Figure 3:
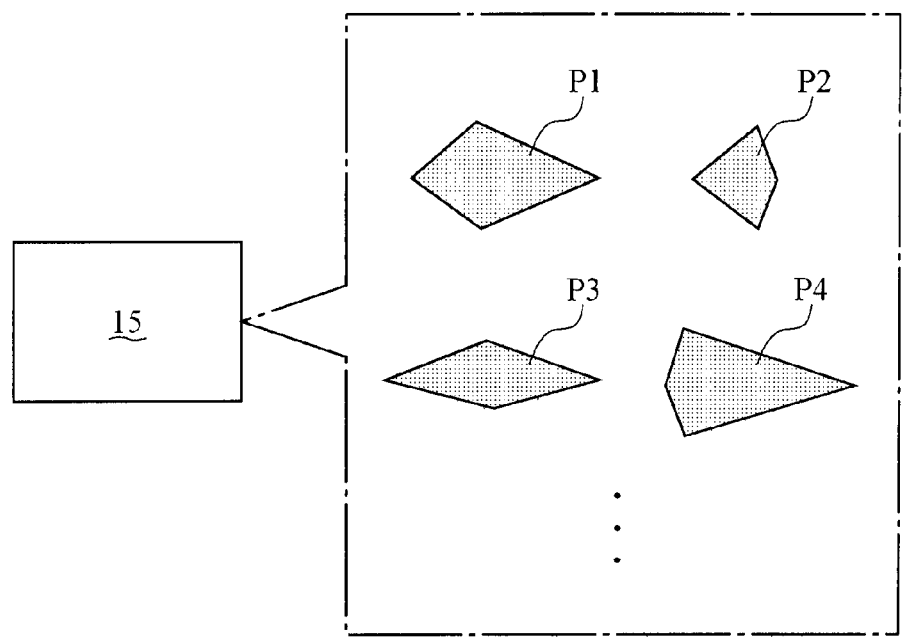
FIG. 3 shows an analysis of the elastic waves in an AE signal analysis device.
Figure 4:
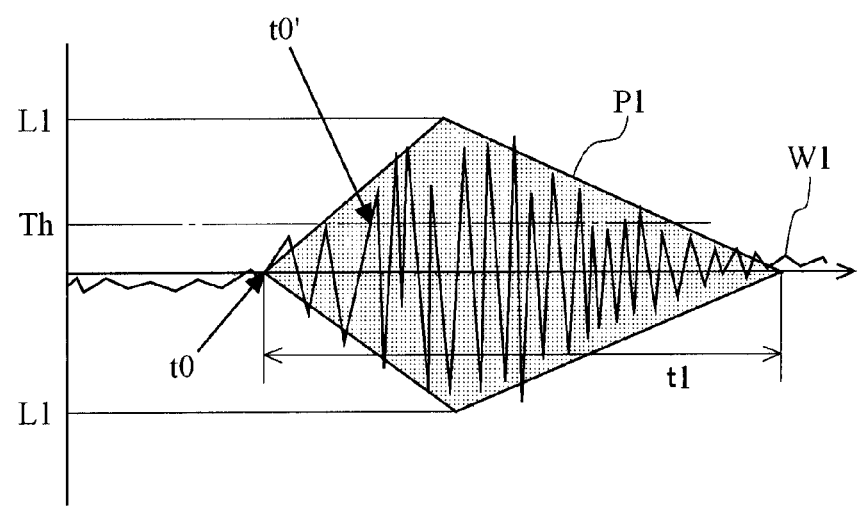
FIG. 4 shows an example of a wave pattern for the AE signal analysis device.

In detail, FIGS. 3 and 4 illustrates the analysis in the AE signal analysis device 15.

As illustrated in FIG. 3, the analysis device 15 stores the characteristics of the elastic waves W as individual wave patterns P1, P2, P3, and so on, each of which is generated due to the reaction such as (1) the decomposition of the electrolyte, (2) the formation of the SEI layer on the surface of the electrode, (3) the change of the crystal structure of the materials due to the intercalation of the lithium ion, or (4) the change of the interparticle distance. The analysis device 15 includes a storing means for storing the wave patterns P1, P2, P3, . . .

For instance, as shown in FIG. 4, through experiment or simulation, the AE sensor 13 detects the elastic wave W1 caused by the generation of internal gas due to (1) the decomposition of the electrolyte, and the AE signal analysis device 15 stores the figural pattern drawn by connecting the outline of the waveform formed with duration t1 and amplitude L1 as the wave pattern P1.

Noted that the timing of initial appearance of the elastic wave is defined as the time t0 in FIG. 4, but the conventional method using the threshold Th determines the timing of initial appearance as the time t0'. On the other hand, due to the pattern matching using the wave patterns P1, P2, . . . according to this embodiment, the accurate timing of initial appearance can be estimated.

The AE signal analysis device 15 compares the wave pattern P detected by the AE sensors 13 with the wave patterns P1, P2, P3, . . . and determines the reaction, thereby estimating the timing of initial appearance of the reactions occurred in the battery 1.

In this embodiment, "comparing the wave pattern" means performing the matching of the detected wave pattern P to the wave patterns P1, P2, P3, . . . prepared in advance. For example, that means determining the wave pattern P as a similar figure to one of the prepared patterns or a combination thereof, and estimating the composition of the wave pattern P.

Moreover, the analysis device 15 picks up one reaction from the reactions determined by the pattern matching for the wave pattern P, and estimates the timing of initial appearance thereof and determines the location where the reaction occurred.

For example, when the elastic wave W is picked up using the AE sensors 13 and the analysis device 15 as the particular reaction, the conventional positioning method such as triangulation method determines the genesis location based on the difference in the time when the sensors detect the initial appearance and the location of the AE sensors 13.

As described above, the detection device 10 has the AE sensors 13 for detecting the elastic wave W and the AE signal analysis device 15 for analyzing the detected data, so that the detection device can accurately determine the types of reactions and the reaction locations in the battery 1.

Figure 5:
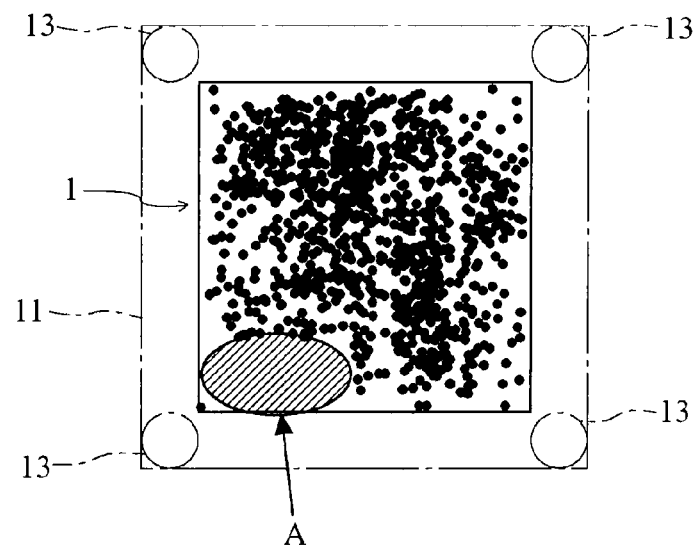
FIG. 5 depicts a result analyzed by the AE signal analysis device.

The detection result detected by the detection device 10 during the charging process of the battery 1 may be used as follows. As shown in FIG. 5, if there is an area where the density of the charging reactions is low in the battery 1 (the area A in FIG. 5), the area is identified as the defected area (e.g., the area with bias of the electrode active materials or uneven coating of the electrode materials in the power generating element 2) in the previous process of the charging process in the manufacturing process for the battery 1, and thereby the manufacturing process can be improved by solving the defect.

The power generating element 2 is made through a process for producing a compound by mixing an electrode active material, a binder and an electrical conductive material, a process for coating the compound on a current collecting sheet, a process for drying the compound coated on the sheet, and a process for pressing the sheet and the compound.

That is, the detection device 10 can be used for detecting the variation in production in the manufacturing process or the variation in performance in the charging process. Moreover, the detection result from the detection device 10 can be used for reviewing the materials of the battery 1 or the manufacturing accuracy in each process of the manufacturing process for the battery 1.

[Second Embodiment]

The second embodiment of the present invention is a detection device 20 for detecting the elastic wave W generated in the battery 1.

Figure 6:
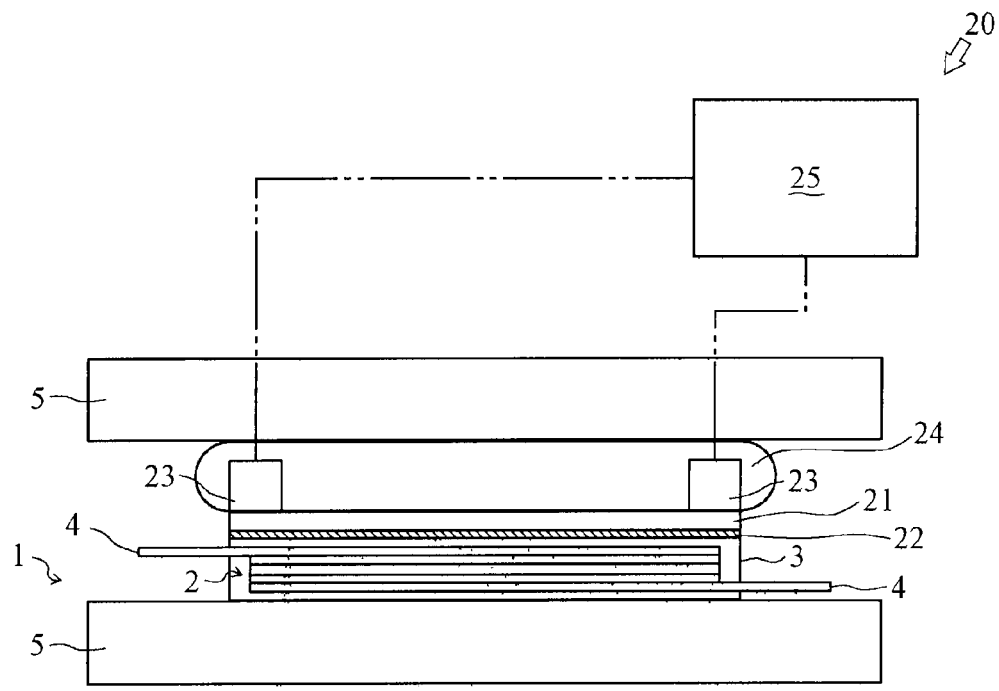
FIG. 6 illustrates an alternative embodiment of the detection device for detecting the internal state of the battery.

As depicted in FIG. 6, the detection device 20 includes a rigid non-metallic plate 21, a coupling medium 12, four AE sensors 23, an elastic layer 24 and an AE signal analysis device 25.

The non-metallic plate 21 is configured as the same as the non-metallic plate 11 of the detection device 10, having the similar effects. As shown in FIG. 6, viewed from the restraining direction, the plate 21 is as large as the battery 1.

The coupling medium 22 is as the same as the coupling medium 12 of the detection device 10, and the effects thereof are the same. The coupling medium 22 is disposed between the battery 1 and the non-metallic plate 21.

The AE sensors 23 are configured as the same as the AE sensors 13 of the detection device 10, having the same effects. The AE sensors 23 also detect the elastic wave W generated in the battery 1. The AE sensors 23 are located and fixed at the corners of the non-metallic plate 21. The AE sensors 23 are electrically connected to the AE signal analysis device 25.

The elastic layer 24 has the same structure and effects as the elastic layer 14 of the detection device 10. As shown in FIG. 6, viewed from the restraining direction, the elastic layer 24 is as large as the non-metallic plate 21, and the elastic layer 24 contains the four AE sensors 23.

In the detection device 20, the AE sensors 23 are disposed inside the elastic layer 24, and the AE sensors 23 are located at the four corners of the battery 1 in which the reactions occur. Thus, the reactions occurred in the battery 1 are detected more directly, thereby improving the detection accuracy.

It should be noticed that the signal wires of the AE sensors 23 penetrate the elastic layer 24, in which the sealing performance is secured.

The AE signal analysis device 25 is configured as the same as the analysis device 15 of the detection device 10, thereby having the same effects. The analysis device 25 estimates the timing of initial appearance of the elastic waves based on the detection data from the AE sensors 23, and determines the reaction locations by calculating the difference of the time of approvals of the signals to the AE sensors 23.

The analyzing method of the AE signal analysis device 25 is same as that of the AE signal analysis device 15.

[Third Embodiment]

The third embodiment of the present invention is a detection device 30 for detecting the elastic wave W generated in the battery 1.

Figure 7:
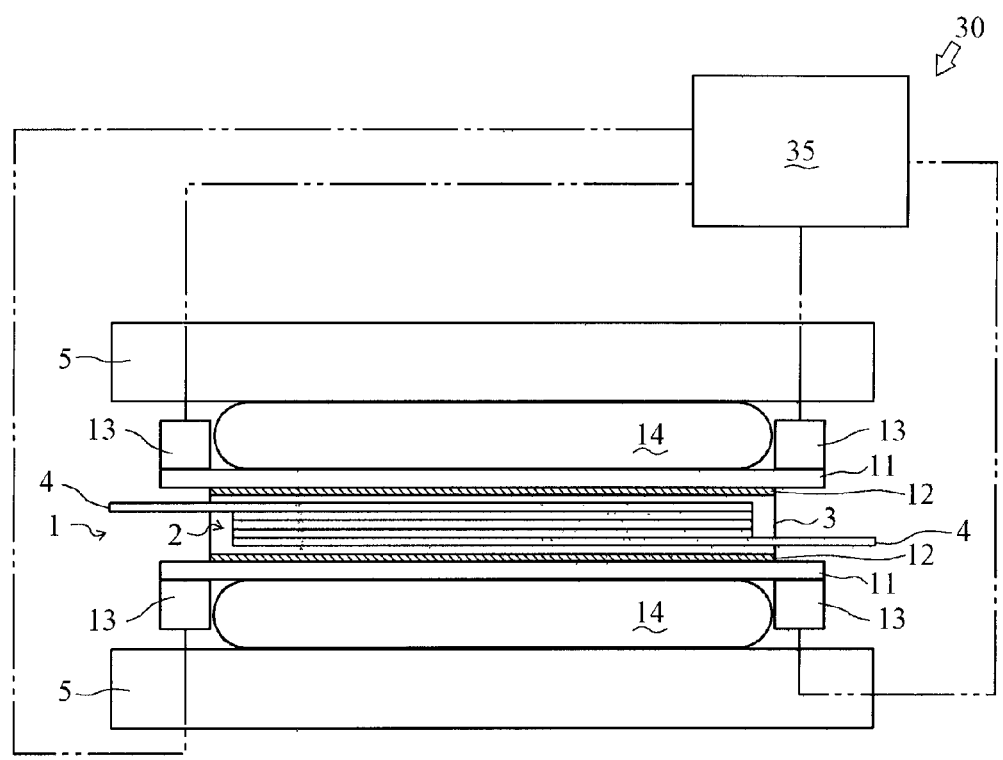
FIG. 7 illustrates another embodiment of the detection device for detecting the internal state of the battery.

As depicted in FIG. 7, the detection device 30 includes the rigid non-metallic plates 11, the coupling media 12, the AE sensors 13 and the elastic layers 14 of the detection device 10, all of which are disposed at both wide faces of the battery 1. The detection device 30 further includes an AE signal analysis device 35. The analysis device 35 is connected with the eight AE sensors 13, and analyzes the elastic wave W on the basis of the detection data transmitted from the AE sensors 13.

The detection device 30 makes the tiny elastic wave W generated in the battery 1 travel toward the both sides of the battery 1 and detects the elastic wave from the both sides of the wide faces. Therefore, the AE signal analysis device 35 can three-dimensionally determine the reaction location in the battery 1, thereby grasping the reactions more specifically.

The battery 1 is located between the elastic layers 14, so that the elastic layers 14 separate the restraining plates 5 from the battery 1. Thus, the elastic wave W is avoided traveling outside of the detectable range of the detection device 30, thereby rigorously detecting the elastic wave W resulted from the internal reaction inside the battery 1, and the detection device can detect more type of reactions.

In the first embodiment through the third embodiment, the AE sensors are located at the four corners on the wade face of the battery 1. However, the number of the AE sensors may be more than three, which is the least number capable of detecting the genesis location of the elastic wave W that is generated at the particular point. Thereby, the number of the sensors may be selectable in accordance with the configuration of the battery 1 or the detection performance of the sensors.

In the first embodiment through the third embodiment, the detection devices detect the change of internal state of the battery 1 during the charging process. However, the applicable range of these detection devices 10, 20, 30, which detect the change of the internal state of the battery 1, are not only in the charging process but also in the aging process in which the battery 1 is restrained by the restraining members that press the battery as the restraining plates 5.

INDUSTRIAL APPLICABILITY

The present invention is applicable to a technique of determining the internal reaction of the battery, especially to a detection technique of accurately detecting the tiny elastic wave accompanying the reaction inside the battery.

The invention claimed is:

1. A detection device for detecting an internal state of a battery comprising:
   a restraining member for pressing the battery;
   a non-metallic plate disposed between the battery and the restraining member; and
   multiple AE sensors located on the non-metallic plate,
   wherein the multiple AE sensors detect an elastic wave generated in the battery, pressing the battery with the restraining member, and
   wherein the detection device analyzes the detected elastic wave and determines the internal state of the battery.

2. The detection device according to claim 1, further comprising means for storing multiple wave patterns prepared in advance,
   wherein the analysis for the elastic wave is performed by comparing a wave pattern detected by the AE sensors with the wave patterns.

3. The detection device according to claim 1, further comprising an elastic member disposed between the restraining member and the non-metallic plate.

4. The detection device according to claim 1, further comprising a coupling medium disposed between the battery and the non-metallic plate.

5. A detection method for detecting an internal state of a battery comprising:
   locating a non-metallic plate such that the non-metallic plate wholly contacts a wide face of the battery, through which a pressure is applied to the battery by using a restraining member having a larger area than the wide face of the battery;
   preparing multiple AE sensors detecting an elastic wave generated in the battery on the non-metallic plate; and
   analyzing the elastic wave detected by the multiple AE sensors and determining the internal state of the battery.

6. The detection method according to claim 5,
   wherein the analysis for the elastic wave is performed by comparing a wave pattern detected by the AE sensors with the wave patterns.

* * * * *